(12) United States Patent
Cao et al.

(10) Patent No.: US 10,025,198 B2
(45) Date of Patent: Jul. 17, 2018

(54) SMART SELECTION AND/OR WEIGHTING OF PARAMETERS FOR LITHOGRAPHIC PROCESS SIMULATION

(75) Inventors: Yu Cao, Cupertino, CA (US); Wenjin Shao, Sunnyvale, CA (US); Hanying Feng, Fremont, CA (US); Fei Du, Santa Clara, CA (US); Martin Snajdr, Millbrae, CA (US)

(73) Assignee: ASML Netherlands B.V., Veldhoven (NL)

( * ) Notice: Subject to any disclaimer, the term of this patent is extended or adjusted under 35 U.S.C. 154(b) by 1543 days.

(21) Appl. No.: 12/615,004

(22) Filed: Nov. 9, 2009

(65) Prior Publication Data

US 2011/0113390 A1    May 12, 2011
US 2012/0005637 A9    Jan. 5, 2012

Related U.S. Application Data

(63) Continuation-in-part of application No. PCT/US2009/049792, filed on Jul. 7, 2009.

(60) Provisional application No. 61/078,599, filed on Jul. 7, 2008.

(51) Int. Cl.
     *G06F 17/50*      (2006.01)
     *G03F 7/20*      (2006.01)

(52) U.S. Cl.
     CPC .......... *G03F 7/705* (2013.01); *G03F 7/70666* (2013.01)

(58) Field of Classification Search
     USPC .......................................................... 716/21
     See application file for complete search history.

(56) References Cited

U.S. PATENT DOCUMENTS

| | | | |
|---|---|---|---|
| 5,680,588 A | 10/1997 | Gortych | |
| 6,046,792 A | 4/2000 | Van der Werf et al. | |
| 6,871,337 B2 | 3/2005 | Socha | |
| 7,003,758 B2 | 2/2006 | Ye et al. | |
| 7,587,704 B2* | 9/2009 | Ye | G03F 7/70441 378/35 |
| 7,788,628 B1* | 8/2010 | Wei | G03F 7/70425 716/51 |

(Continued)

FOREIGN PATENT DOCUMENTS

| | | |
|---|---|---|
| EP | 1465016 | 10/2004 |
| EP | 1793279 | 6/2007 |

OTHER PUBLICATIONS

Born & Wolf, "Principles of Optics", 1999, pp. 602-606.

(Continued)

*Primary Examiner* — Mohammed Alam
(74) *Attorney, Agent, or Firm* — Pillsbury Winthrop Shaw Pittman LLP

(57) ABSTRACT

The present invention generally relates to simulating a lithographic process, and more particularly to methods for smart selection and smart weighting when selecting parameters and/or kernels used in aerial image computation. According to one aspect, advantages in simulation throughput and/or accuracy can be achieved by selecting TCC kernels more intelligently, allowing highly accurate aerial images to be simulated using a relatively fewer number of TCC kernels than in the state of the art. In other words, the present invention allows for aerial images to be simulated with the same or better accuracy using much less simulation throughput than required in the prior art, all else being equal.

23 Claims, 12 Drawing Sheets

(56) References Cited

U.S. PATENT DOCUMENTS

| | | | |
|---|---|---|---|
| 2004/0197672 A1 | 10/2004 | Weed et al. | |
| 2005/0015233 A1* | 1/2005 | Gordon | G03F 1/36 703/13 |
| 2005/0195379 A1 | 9/2005 | Stanton | |
| 2007/0253637 A1* | 11/2007 | Adam | 382/274 |
| 2008/0170773 A1* | 7/2008 | Wihl et al. | 382/144 |
| 2011/0113390 A1* | 5/2011 | Cao | G03F 1/68 716/55 |
| 2011/0299759 A1* | 12/2011 | Shi et al. | 382/144 |
| 2012/0216156 A1* | 8/2012 | Liu | G03F 1/144 716/52 |

OTHER PUBLICATIONS

Cao, et al., "Optimized Hardware and Software for Fast, Full Chip Simulation", Optical Microlithography XVIII, Proc. Of SPIE, vol. 5754, 2005, pp. 407-414.

Cobb, "Fast Optical and Process Proximity Correction Algorithms for Integrated Circuit manufacturing", Ph.D. Dissertation, UC Berkeley, Spring 1998, pp. 1-123.

Gordon, "Exact Computation of Scalar, 2D Aerial Imagery", Proc. Of SPIE, vol. 4692, 2002, pp. 517-528.

Pati, Y.C., et al., "Phase-Shifting Masks for Microlithography: Automated Design and Mask Requirements", J. Opt. Soc. Am. A., 1992, vol. 11, No. 9, pp. 2438-2452.

International Preliminary Report on Patentability dated Jan. 20, 2011 in corresponding International Application No. PCT/US2009/049792.

International Search Report and Written Opinion dated Oct. 13, 2009 for PCT Application No. PCT/US2009/049792.

\* cited by examiner

FIG. 9A                    FIG. 9B

SMART SELECTION AND/OR WEIGHTING OF PARAMETERS FOR LITHOGRAPHIC PROCESS SIMULATION

CROSS-REFERENCE TO RELATED APPLICATIONS

The present application is a continuation-in-part of prior PCT Application No. PCT/US2009/049792, filed Jul. 7, 2009, which claims priority to U.S. Provisional Application No. 61/078,599, filed Jul. 7, 2008.

FIELD

The present invention generally relates to a method and computer program product for simulating imaging results associated with a lithographic process, and more particularly, to a smart selection and smart weighting method for selecting parameters and/or kernels used in aerial image computation.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

The manufacturing process of an integrated circuit involves imaging multiple layers of circuit patterns onto a semiconductor wafer. To address the increasingly demanding needs of the semiconductor industry where the dimensions of the circuit elements are continually being reduced, technologies such as customized illumination schemes, phase shifting masks, and optical proximity correction (OPC) may be used. Numerical methods known as "computational lithography" are often required to simulate the lithography process to ensure the printed patterns meet the design target and to keep experimental costs under control. It is desirable that these numerical methods be highly accurate in order to predict the changes in aerial images (AIs) and critical dimensions (CDs) caused by small perturbations, also known as "sensitivities", to the optical settings.

In a lithography simulation system, the optical properties of the scanner optics need to be characterized such that the aerial image of the mask within the resist layer is predicted correctly. In most applications, the optical system is modeled using model parameters, which are translated into mathematical coefficients or terms that are used in performing computational lithography. Generally, using a limited number of terms will increase system throughput, yet introduce more error in simulation and less reliable results. Accordingly, there is a need for methods that allow for fewer terms to be used, while retaining sufficient accuracy.

SUMMARY

The present invention generally relates to simulating a lithographic process, and more particularly to methods for smart selection and/or smart weighting when selecting parameters and/or kernels used in aerial image computation. According to one aspect, advantages in simulation throughput and/or accuracy can be achieved by selecting TCC kernels more intelligently, allowing highly accurate aerial images to be simulated using a relatively fewer number of TCC kernels than in the state of the art. In other words, the present invention allows for aerial images to be simulated with the same or better accuracy using much less simulation throughput than required in the prior art, all else being equal.

In furtherance of these and other aspects, a method according to embodiments of the invention includes identifying a model for simulating performance of a lithographic process, the model being capable of being expressed as a mathematical series with a plurality of terms, which when combined with a mathematical representation a mask, generates a result that simulates the performance of the lithographic process using the mask, identifying characteristics of a desired mask layout, selecting a subset of the plurality terms based on the identified characteristics.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 9A, 9B and 9C further illustrate improved simulation performance and/or accuracy using embodiments of the invention;

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
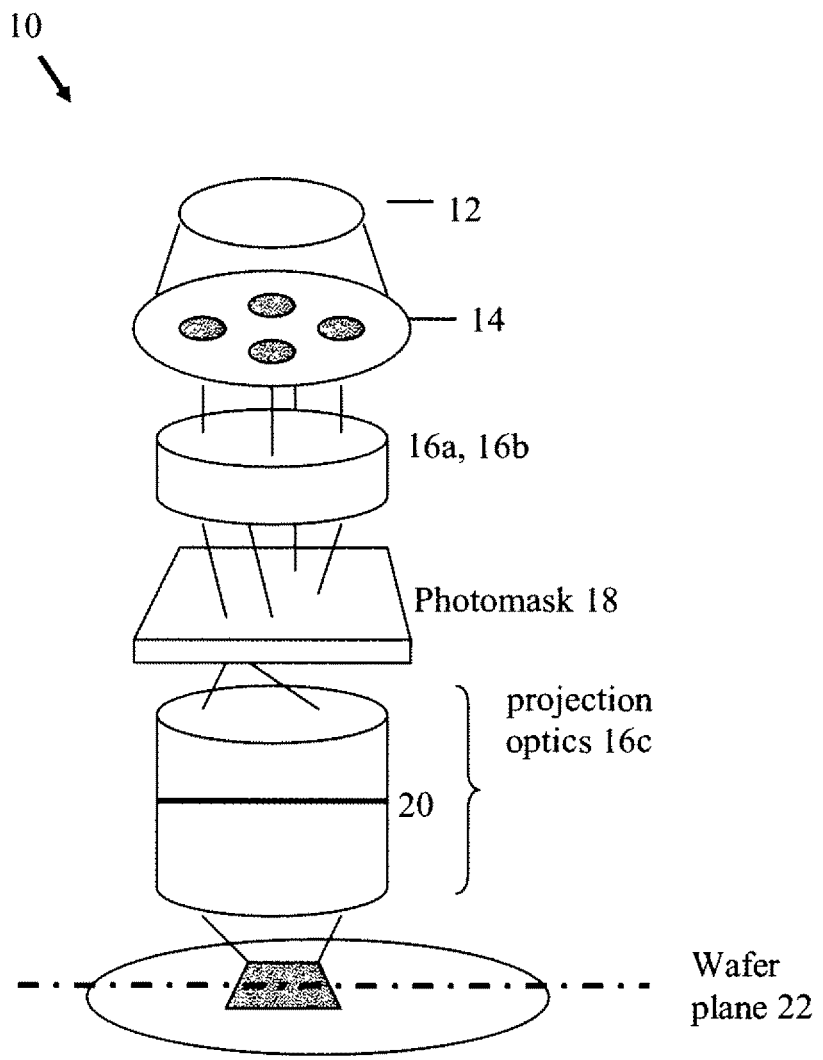
FIG. 1 is an exemplary block diagram illustrating a typical lithographic projection system.

Prior to discussing the present invention, a brief discussion regarding the overall simulation and imaging process to be calibrated is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin($\iota_{max}$).

Figure 2:
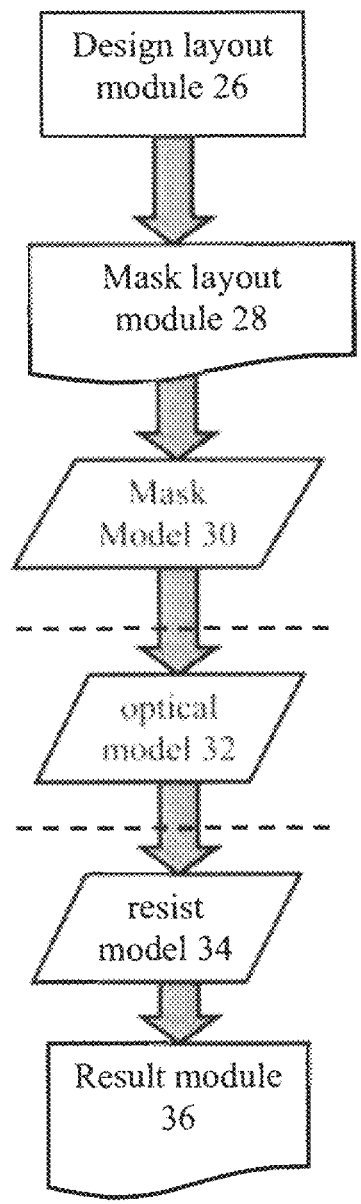
FIG. 2 is an exemplary block diagram illustrating the functional modules of a lithographic simulation model.

In a lithography simulation system, these major system components are described by separate functional modules, for example, as illustrated in FIG. 2. Referring to FIG. 2, the functional modules include the design layout module 26, which defines the target design; the mask layout module 28, which defines how the mask is laid out using the target design to be utilized in the imaging process; the mask model module 30, which models the properties of the physical mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma (σ) settings as well as any particular illumination source shape, where σ(or sigma) is the inner and/or outer radial extent of the illuminator. The optical properties of the photo-resist layer coated on a substrate—i.e. refractive index, film thickness, propagation and polarization effects—may also be captured as part of the optical model module 32. The mask model module 30 captures how the target design features are laid out in the reticle and may also include a representation of detailed physical properties of the mask, as described, for example, in U.S. Pat. No. 7,587,704.

Finally, the resist model module 34 describes the effects of chemical processes which occur during resist exposure, PEB and development, in order to predict, for example, contours of resist features formed on the substrate wafer. The objective of the simulation is to accurately predict, for example, edge placements and critical dimensions (CDs), which can then be compared against the target design. The target design is generally defined as the pre-OPC mask layout, and will be provided in a standardized digital file format such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (i.e. aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

One efficient implementation of a lithography model that can be used for aerial image simulation uses the following formalism, where the image (here in scalar form, which may be extended to include polarization vector effects) is expressed as a Fourier sum over signal amplitudes in the pupil plane. More particularly, according to Hopkins theory, the aerial image intensity can be calculated by:

$$AI(x)=\Sigma_k\Sigma_{k''}TCC_{k',k''}M(k')M^*(k'')\exp(-j(k'-k'')x),$$

where M(k) is the Fourier Transform of the mask image and TCC is the "raw" TCC matrix, which captures all the model parameters of a lithographic process.

Through diagonalization, the raw TCC matrix can be decomposed as $$TCC_{k',k''}=\Sigma_i\lambda_i\Phi_i(k')\Phi_i^*(k''),$$

where $\lambda_i$ is the eigenvalue, and $\Phi_i$ is the corresponding eigenvector. Theoretically, the index i can be infinite. Accordingly, the aerial image intensity can be calculated by:

$$\begin{aligned}AI(x) &= \sum_{k'}\sum_{k''} TCC_{k',k''} M(k')M^*(k'')\exp(-j(k'-k'')x) \\ &= \sum_{k'}\sum_{k''}\sum_{i=1}^{N}\lambda_i\phi_i(k')\phi_i^*(k'')M(k')M^*(k'')\exp(-j(k'-k'')x) \\ &= \sum_{i=1}^{N}\lambda_i\sum_{k'}\phi_i(k')M(k')\exp(-jk'x)\sum_{k''}\phi_i^*(k'')M^*(k'')\exp(jk''x) \\ &= \sum_{i=1}^{N}\lambda_i|\Phi_i(x)|^2 \\ &\text{Where } \Phi_i(x) = \sum_{k''}\phi_i(k'')M(k'')\exp(-jk''x)\end{aligned}$$

Using a large number of TCC terms (i.e., i=1 to N, where N is 1024 or more) in the above equation, and a highly calibrated model, will lead to an accurate simulation of the aerial image intensity for any given mask layout. Additional information regarding the calculation of an aerial image can be gleaned from U.S. Pat. No. 6,871,337 entitled "Illumination Optimization For Specific Mask Patterns", the contents of which is incorporated herein in its entirety by reference.

However, the time and/or processing power required to perform aerial image simulation using the above method is generally linearly related to the number of TCC kernels used, so using fewer TCC kernels will improve the simulation throughput. For example, using 64 TCC kernels typically provides sufficient accuracy for most OPC and Lithographic Manufacturability Check (LMC) applications. However, for some scanner tuning applications, it is desired to simulate the changes in aerial image intensity or CD as induced by small perturbations in the optical settings (e.g. $\Delta$NA around 0.01 and/or $\Delta\sigma$ around 0.01), and up to 1024 TCC kernels have to be used to achieve the necessary accuracy for some cases. Using this large number of kernels significantly deteriorates the simulation throughput.

In the current state of the art, eigenvalues and corresponding TCC kernels are ranked in order of magnitude. So, where only 64 TCC kernels are needed and/or used for a desired amount of accuracy, the 64 TCC kernels with the 64 largest eigenvalues are selected. Alternatively, where 1024 TCC kernels are needed, the 1024 TCC kernels with the 1024 largest eigenvalues are selected.

The present inventors have recognized that advantages can be achieved by selecting TCC kernels more intelligently, allowing highly accurate aerial images to be simulated using a relatively fewer number of TCC kernels than in the state of the art. In other words, the present invention allows for aerial images to be simulated with the same or better accuracy using much less simulation throughput than required in the prior art, all else being equal.

In general, the present inventors recognize that the conventional approach of ranking and truncating the TCC eigenseries based on magnitude of eigenvalues alone ignores potentially valuable knowledge about the mask layout. Keeping N TCC kernels corresponding to the largest eigenvalues would minimize the Hilbert-Schmidt norm of the residual difference:

$$TCC_{k',k''} - \sum_{i=1}^{N} \lambda_i \phi_i(k') \phi_i^*(k'')$$

where all the matrix elements of the raw TCC are given the same weight.

Figure 3:
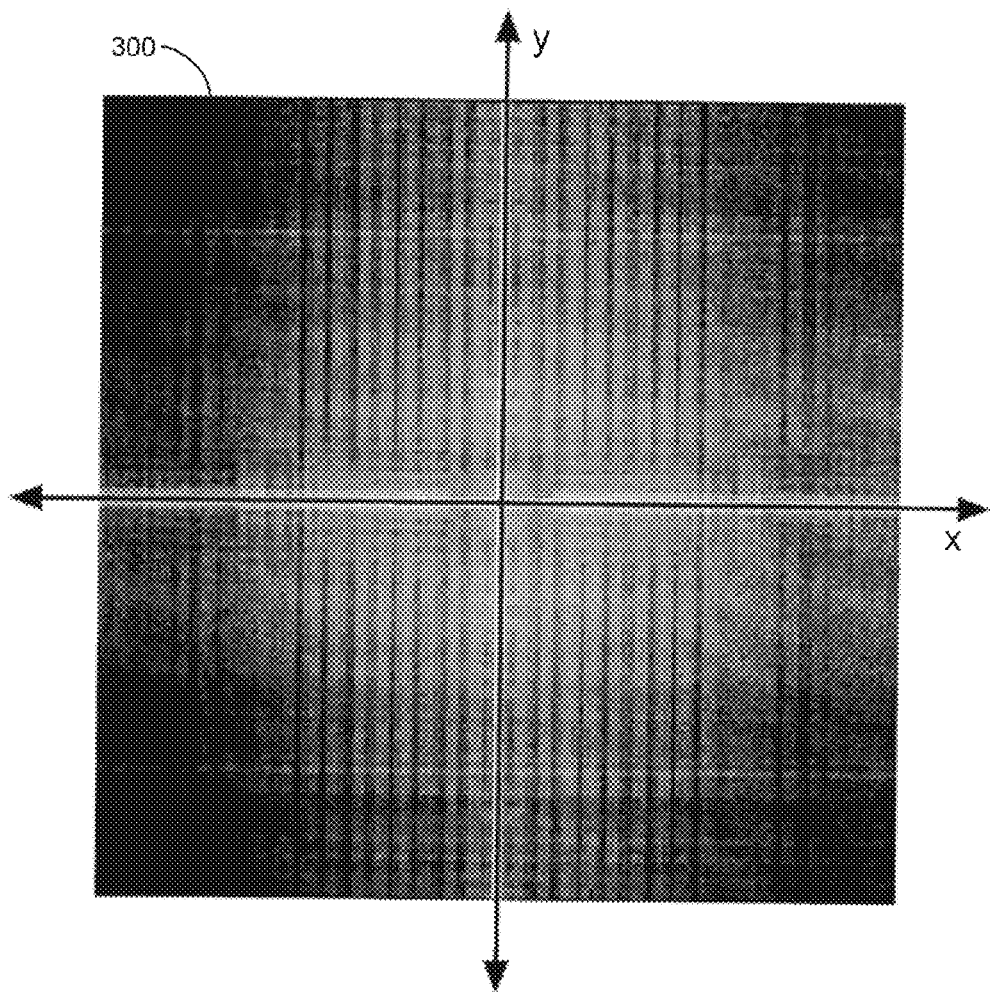
FIG. 3 depicts the spatial frequency characteristics of a mask layout containing predominantly Manhattan type patterns.

However, the present inventors further recognize that certain information about the mask layout for which aerial image simulations are to be performed may exist at the time of TCC computation. This information can be used to weight the terms unevenly in some manner, and in consideration of actual applications. For example, if most of the layout patterns are Manhattan line-space patterns, their spatial frequency will concentrate on the x- and y-axes with a large DC component, as shown in FIG. 3. More particularly, FIG. 3 depicts a graph 300 of the spatial frequencies present in a Manhattan line-space pattern, for example, a pattern obtained from the Proxi45 set of test patterns from ASML of Veldhoven Netherlands. In the graph 300, a lighter shade indicates the presence of more spatial frequency components, whereas darker shades indicate the absence of spatial frequency components, on a logarithmic scale.

Accordingly, in embodiments of the invention, after decomposing the raw TCC matrix in the conventional way, instead of ranking the TCC kernels by eigenvalues, the present invention ranks them by their contributions to the simulated aerial image intensity generated using a "smart mask" $\tilde{M}$, whose spatial spectrum approximates a desired type of mask layout, as will be more appreciated by the descriptions below.

Figure 4:
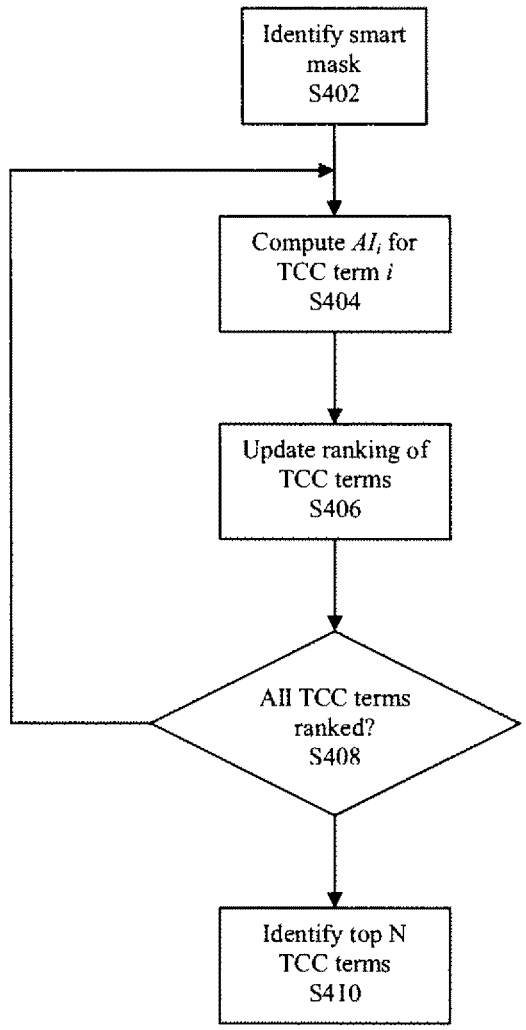
FIG. 4 is a flowchart representing a method for smart selection of TCC terms, in accordance with an embodiment of the invention.

FIG. 4 is a flowchart illustrating this first example embodiment according to the principles of the invention. As shown in step S402, a smart mask is selected.

In one example, the following smart mask is used:

$$\tilde{M}(k_x, k_y) = \begin{cases} 0.01 & k_x k_y \neq 0, \\ 1 & k_x = 0 \text{ or } k_y = 0, \\ 15 & k_x = 0 \text{ and } k_y = 0, \end{cases}$$

where $\tilde{M}$ represents a Fourier transform of a spatial image of a mask, and $k_x$ and $k_y$ are spatial frequency components corresponding to the x and y axes, respectively. The inventors have found this "smart mask" to be suitable for a mostly Manhattan-shaped layout having a spatial frequency distribution such as that represented in FIG. 3, where the spatial frequency of the patterns concentrates on the x and y axes, and has a large DC component. Accordingly, as shown above, these spatial frequency components in the smart mask are weighted substantially higher relative to non-zero x and y components. It should be noted that the values provided above are just one example, and are non-limiting. For example, acceptable results may be obtained with a smart mask having only a DC component, rather than having some x and y-axes components as in the example above.

It should be further noted that different types of smart masks can be determined by analysis of the spatial frequency characteristics of other types of actual mask layouts. For example, the inventors have found that the Manhattan-shaped layout accounts for about 80% to 90% of layers in a typical integrated circuit chip design. However, other types of actual mask layouts may predominate in different integrated circuit designs which have different spatial frequency characteristics. Analysis of these characteristics can produce other smart masks, as will be appreciated by those skilled in the art after being taught by the present invention.

Next in step S404, the contribution to the aerial image intensity $AI_i$ for each diagonalized TCC term is determined as follows:

$$AI_i(x) = \lambda_i |\Phi_i(x)|^2$$

where, using the "smart mask" above:

$$\Phi_i(x) = \sum_{k''} \phi_i(k'') \tilde{M}(k'') \exp(-jk''x)$$

As each aerial image intensity contribution is determined, the ranking of TCC terms associated with them is adjusted, as shown in step S406.

When all of the contributions have been determined (as checked in step S408), the N TCC terms resulting in the N highest values of $AI_i$ are retained in step S410. These TCC terms can then be used to perform simulation, for example to simulate the aerial image intensity for a given mask layout and lithographic process.

The number N of terms retained can depend on the particular application and/or the desired amount of accuracy. Importantly, however, the number of terms needed for a desired amount of accuracy is generally much less than the number of terms required in prior art techniques of ranking by eigenvalues alone. This aspect will be described in more detail below.

In another example embodiment, the "smart mask" is used to assign weights to the raw TCC elements, so that after decomposition, the leading eigenvectors will capture the most relevant information in the raw TCC matrix. A flowchart illustrating this "smart weighting" embodiment of the invention is shown in FIG. 5.

Figure 5:
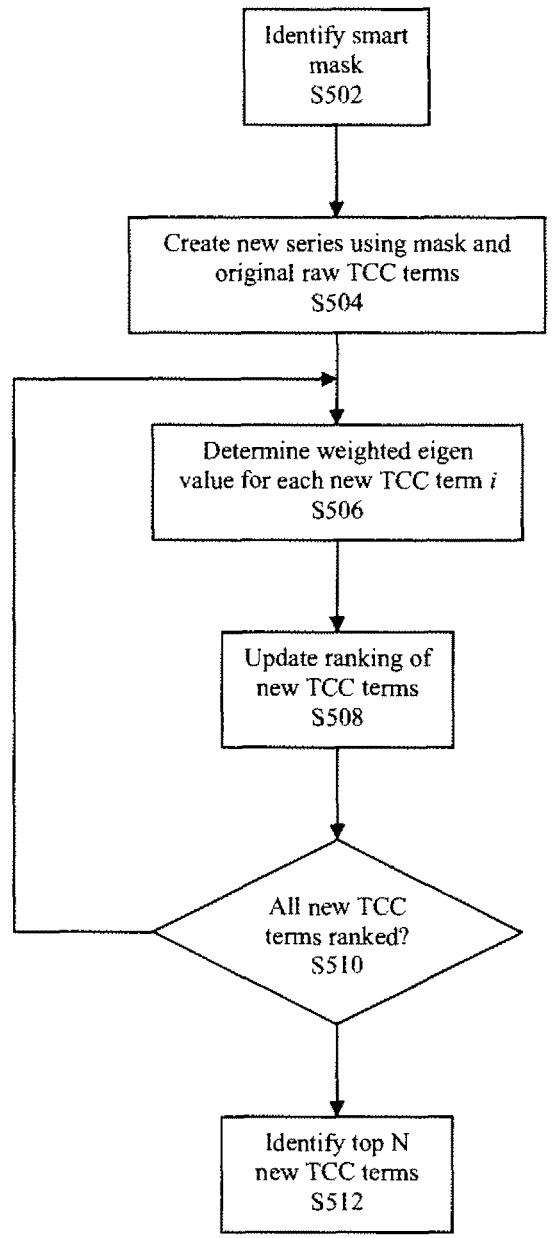
FIG. 5 is a flowchart representing a method for smart weighting of TCC terms, in accordance with an embodiment of the invention.

As shown in FIG. 5, similar to the previous embodiment, a smart mask is selected in step S502. The smart mask described above in the previous embodiment may be used, based on a predominantly Manhattan-shaped layout. However, other smart masks may be used for other types of layouts.

Instead of decomposing the raw TCC to form a series of eigenvalues and eigenvectors as in the previous embodiment, this embodiment decomposes a matrix formed by multiplying the raw TCC elements with the smart mask as follows:

$$TCC_{k',k''}\tilde{M}(k')\tilde{M}^*(k''),$$

or $$TCC_{k',k''}\tilde{M}(k')\tilde{M}^*(k'')\Sigma_i\tilde{\Sigma}_i\tilde{\phi}_i(k')\tilde{\phi}_i^*(k'').$$

Accordingly in step S504, this embodiment expresses the diagonalized TCC terms using the following new series:

$$TCC_{k',k''}=\Sigma_i\tilde{\lambda}_i\tilde{\phi}_i(k')\tilde{\phi}_i^*(k'')/\tilde{M}(k')\tilde{M}^*(k'').$$

This embodiment also differs from the previous embodiment that computes aerial image intensity contributions using the TCC terms. Instead, in steps S506 and S508, for each term in the new series, the TCC kernels are ranked by the weighted eigenvalues $\tilde{\lambda}_i$ directly from the diagonalized terms. This is similar to the prior art approach, except that during the ranking process, the kernels in the new series will be weighted by the aerial image intensity of the smart mask.

Then the N TCC terms from the original series corresponding to the terms in the new series with the highest weighted eigenvalues $\tilde{\lambda}_i$ are retained in step S512. In this case, the first N TCC terms will be able to minimize the Hilbert-Schmidt norm of the weighted residual difference $$\left(TCC_{k',k''} - \sum_{i=1}^{N}\tilde{\lambda}_i(\tilde{\phi}_i(k')/\tilde{M}(k'))(\tilde{\phi}_i^*(k'')/\tilde{M}^*(k''))\right)\tilde{M}(k')\tilde{M}^*(k'')$$

As mentioned above, the present invention allows for fewer TCC terms to be used during simulation to obtain similar accuracy as in the prior art, thereby improving simulation throughput.

Figure 6A:
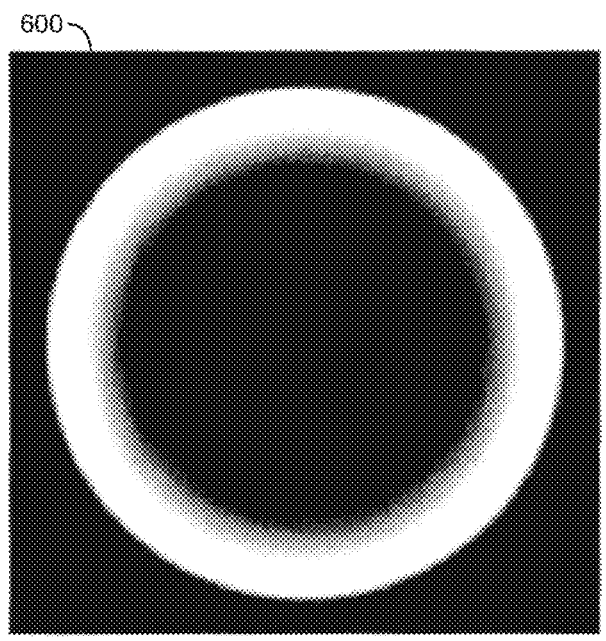
FIGS. 6 to 8 illustrate improved simulation performance and/or accuracy using the embodiments of the invention.
Figure 6B:
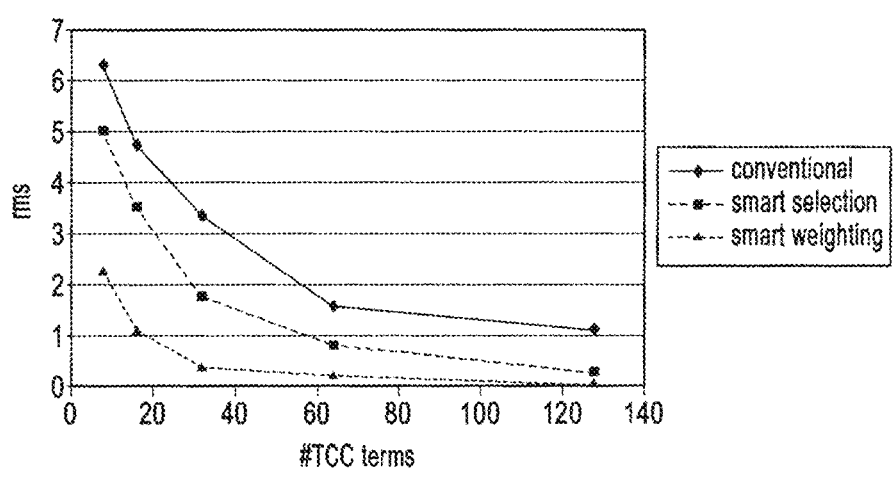
Figure 7A:
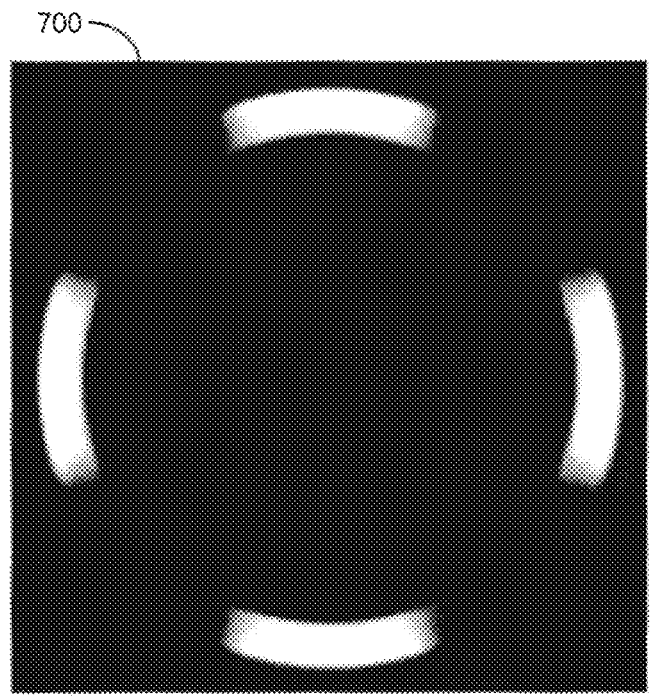
Figure 7B:
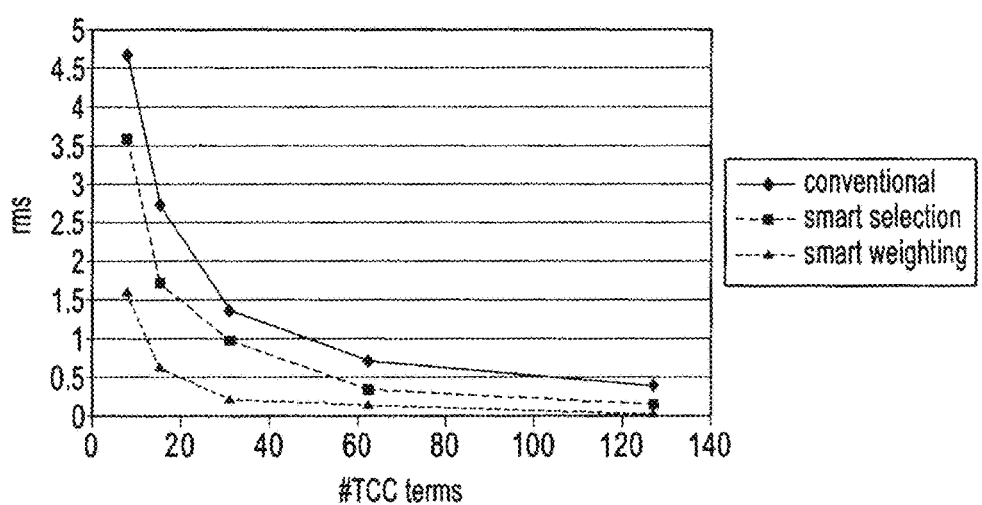
Figure 8A:
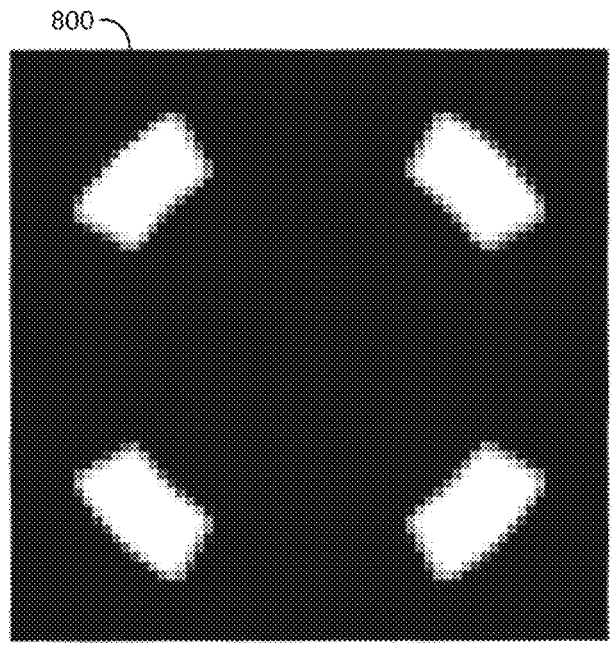
Figure 8B:
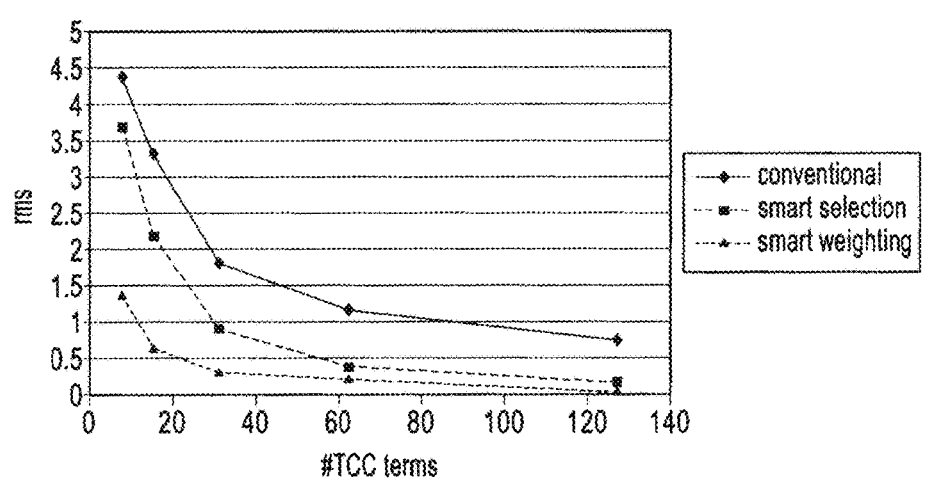

This feature of the present invention is illustrated in more detail in FIGS. 6 to 8. More particularly, the graphs in FIGS. 6B, 7B and 8B depict the simulation errors for the illumination patterns 600, 700 and 800 shown in FIGS. 6A, 7A and 8A, respectively. More particularly, the x-axis in each graph increases by the number of TCC terms used in simulation. The y-axis in each graph indicates the rms error between a plurality of test gauges and corresponding simulation results. Each graph contains three curves, corresponding to conventional simulation, simulation using the smart TCC selection method of the first embodiment of the invention, and simulation using the smart TCC weighting method of the second embodiment of the invention, as indicated by the legend in each graph. Among other things, it can be seen that in each case, the accuracy obtained by using 128 TCC terms selected using the conventional method can be achieved using half or fewer TCC terms selected using the methods of the invention.

Figure 9C:
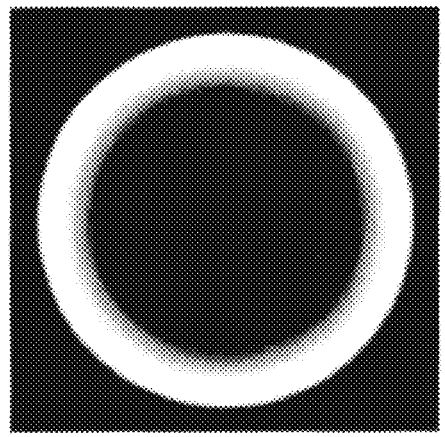
Figure 9C:
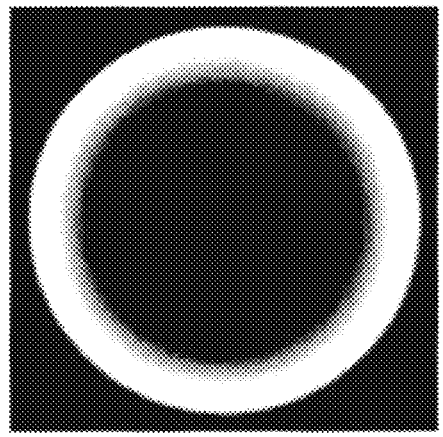
Figure 9C:
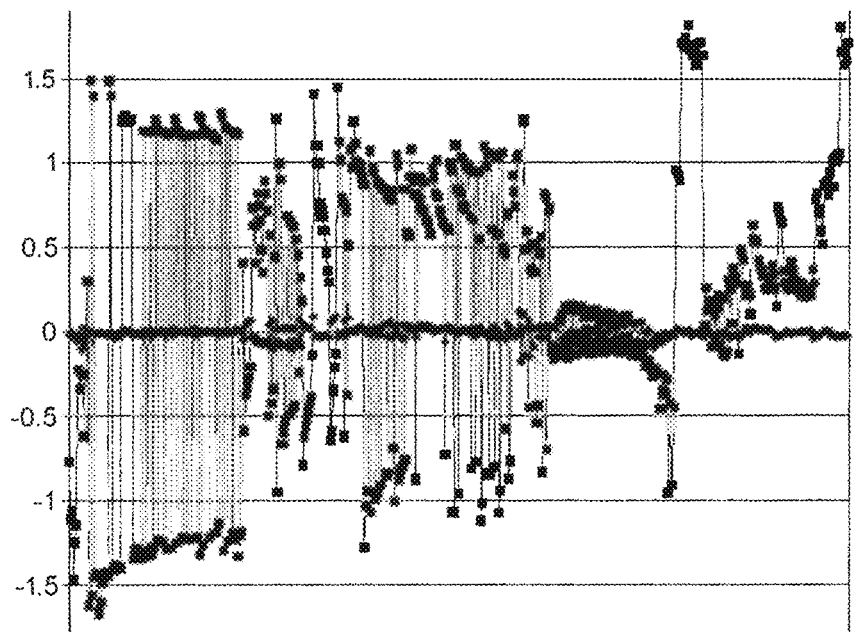

Further aspects and advantages of the TCC weighting embodiment of the invention is illustrated in more detail in FIGS. 9A and 9B. More particularly, the present inventors that this embodiment speeds up simulation to compare different lithographic processes, especially where only slight changes are made between processes. As shown in FIGS. 9A and 9B, for example, the differences can be with respect to an illumination source map, for example changing from sigma inner/outer 0.76/0.96 in FIG. 9A to 0.797/0.997 in FIG. 9B. FIG. 9C shows the error in ACDs when simulating the change in this map. The x-axis corresponds to different test gauges, and the y-axis corresponds to the amount of error in ACD at a given gauge. A first curve 902 indicates the simulated ACD error of simulation using 64 terms selected using conventional TCC selection methods, and a second curve 904 indicates the simulated ACD error of simulation using 64 terms selected using the TCC weighting embodiment of the invention. In both cases, the error is computed versus a conventional simulation using 1024 terms. As can be readily seen, the TCC weighting of the invention yields significantly improved accuracy in sensitivities, providing almost the same results as the conventional method using 1024 terms, in a fraction of the amount of time required in the conventional method.

In other embodiments of the invention, a "hybrid smart selection" method is performed. The hybrid method is a combination of regular TCC kernel selection and smart selection using the method in the embodiment described above. The only change to the smart selection embodiment described above is that after a certain number of kernels is selected using the smart method (e.g. in step S410 described above), a number of regularly selected kernels is added (e.g. using eigenvalue magnitudes as in the prior art), if they are not duplicative of the smart kernels.

This embodiment can be implemented independently for simulating performance of a single base system ("simple hybrid"), as described in more detail in the embodiments above. Additionally or alternatively, this embodiment, as well as the other embodiments described above can be in the Delta TCC sector ("Delta TCC hybrid"), where the lithographic parameters of a base system are perturbed, either within the system itself, or in comparison with another system. This particular embodiment can be combined, for example, with the invention of U.S. patent application Ser. No. 12/614,180, filed on Nov. 6, 2009, now U.S. Pat. No. 8,379,991, the contents of which are incorporated herein by reference.

More particularly, as described in the co-pending application, in a manufacturing environment, it is often desirable to match the performance of an optical system (e.g. a second scanner or a second projection system in a lithographic exposure apparatus) to a reference optical system (e.g. first reference scanner or a first optical system in a lithographic exposure apparatus). Further, it is also desirable to predict the change in the aerial image resulting from a change of the optical setting in a given optical system. This involves tweaking the optical settings on the to-be-tuned optical system, such as the numerical aperture (NA) of the optical system, sigma, stage tilt, and exposure dosage. These changes might be very small. For instance, a change of 0.01 in NA, or 10 mσ in sigma inner/outer values is typical. To predict the changes in aerial images and critical dimensions (CDs) caused by such small perturbations, also known as "sensitivities" to the optical settings, highly accurate optical models are needed.

As optical settings are represented by truncated TCC eigen-series as in the prior art, the truncation-induced errors play a significant role in the model sensitivities. Simulation experiments showed that the conventional setting of 64 TCC terms (also referred to hereinafter as "TCC kernels") is inadequate to capture the perturbation with satisfactory accuracy. In fact, for some cases, up to 1024 TCC kernels are required.

The co-pending application describes methods in which, instead of using two optical models with extremely large sets of TCC kernels to describe the corresponding optical settings and compute the sensitivities, two small sets of TCC kernels are calculated. The first set of TCC kernels describes one of the optical system states (denoted as "base state"), and the second set, referred to as "ΔTCC", describes the change in optical settings of the optical system. A new set of TCC kernels is created using the first and the second set of TCC kernels. The new set of TCC kernels is representative of a second optical system state (denoted as "perturbated state" below). The two TCC sets, i.e. the new set of TCC kernels representative of the perturbated state and the set of TCC kernels representative of the base state are then used for aerial image simulation and/or sensitivity calculations.

The co-pending application further calculates a perturbation function by determining the difference (ΔrawTCC) between the first set of transmission cross-coefficients (rawTCC_0k,k') representative of the base state of the first optical system and a second set of transmission cross-coefficients (rawTCC_1k,k') representative of the perturbated state. The difference (ΔrawTCC) between the first set of transmission cross-coefficients (rawTCC_0k,k') representative of the base state of the first optical system and the second set of transmission cross-coefficients (rawTCC_1k, k') representative of the perturbated state provides a matrix of transmission cross-coefficients, which is diagonalized and truncated. In the co-pending application, the prior art truncation operation is performed to retain a small number n' of TCC kernels, denoted as "ΔdiagTCCk,k'|small", having the highest values. Then a change in aerial image intensity ΔAI is calculated using these kernels rather than directly computing two separate aerial image values using respective sets of kernels for the base and perturbated processes. More particularly, ΔAI=AI(diagTCC_0k,k'|small: ΔdiagTCC|small)−AI((diagTCC_0k,k'|small).

In this embodiment, the smart selection techniques of the present invention are used to determine the Delta TCC kernels to be retained. This can be done either alone, using a process similar to that described in connection with FIG. 4, or in combination with the "hybrid" embodiment described above. Those skilled in the art will be able to understand how to implement this embodiment based on the disclosures above and in the co-pending application, so further details are unnecessary for an understanding of the present invention.

Figure 10:
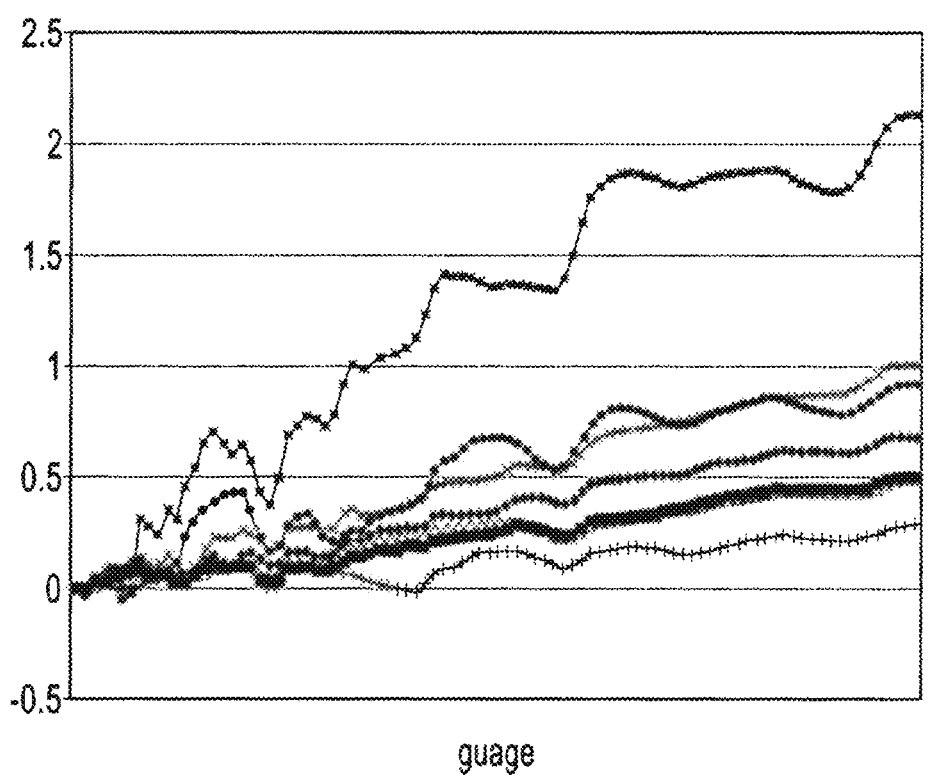
FIG. 10 illustrates improved simulation performance and/or accuracy using hybrid embodiments of the invention, with or without the Delta TCC methods of the co-pending application.

The benefits of these and other embodiments of the invention are shown in FIG. 10. FIG. 10 depicts the absolute error in terms of through pitch between simulated perturbation results using various TCC term selection methods according to the invention and numbers of terms retained versus simulation results using 1024 TCC terms selected in the prior art. In FIG. 10, the x-axis corresponds to different gauges and the y-axis indicates the amount of error at a given gauge.

In this test case, the resulting changes in CDs were estimated between a base process having an illumination source with a sigma inner/outer of 0.76/0.96 and a perturbation process having an illumination source with a sigma inner/outer of 0.797/0.997.

Plot 1002, which shows the most error, and thus the least accurate simulation method, depicts the results of using a simple hybrid technique, with 64 standard TCC terms and 16 smart TCC terms, without using the Delta TCC techniques of the co-pending application.

Plot 1004, which shows the next best simulation method, depicts the results of using a differential hybrid technique, using 64 standard TCC terms for the base TCC, and Delta TCC terms according to the co-pending application, comprising 64 standard TCC terms and 8 smart TCC terms.

Plot 1006, which shows the next best simulation method, depicts the results of using a simple hybrid technique, with 64 standard TCC terms and 32 smart TCC terms, without using the Delta TCC techniques of the co-pending application.

Plot 1008, which shows the next best simulation method, depicts the results of using a differential hybrid technique, using 64 standard TCC terms for the base TCC, and Delta TCC terms according to the co-pending application, comprising 64 standard TCC terms and 16 smart TCC terms.

Plot 1010, which shows the next best simulation method, depicts the results of using a differential hybrid technique, using 64 standard TCC terms for the base TCC, and Delta TCC terms according to the co-pending application, comprising 64 standard TCC terms and 32 smart TCC terms.

Plot 1012, which shows the next best simulation method, depicts the results of using a differential hybrid technique, using 64 standard TCC terms for the base TCC, and Delta TCC terms according to the co-pending application, comprising 64 standard TCC terms and 64 smart TCC terms.

Plot 1014, which shows the best simulation method, depicts the results of using a simple hybrid technique, with 64 standard TCC terms and 64 smart TCC terms, without using the Delta TCC techniques of the co-pending application.

Figure 11:
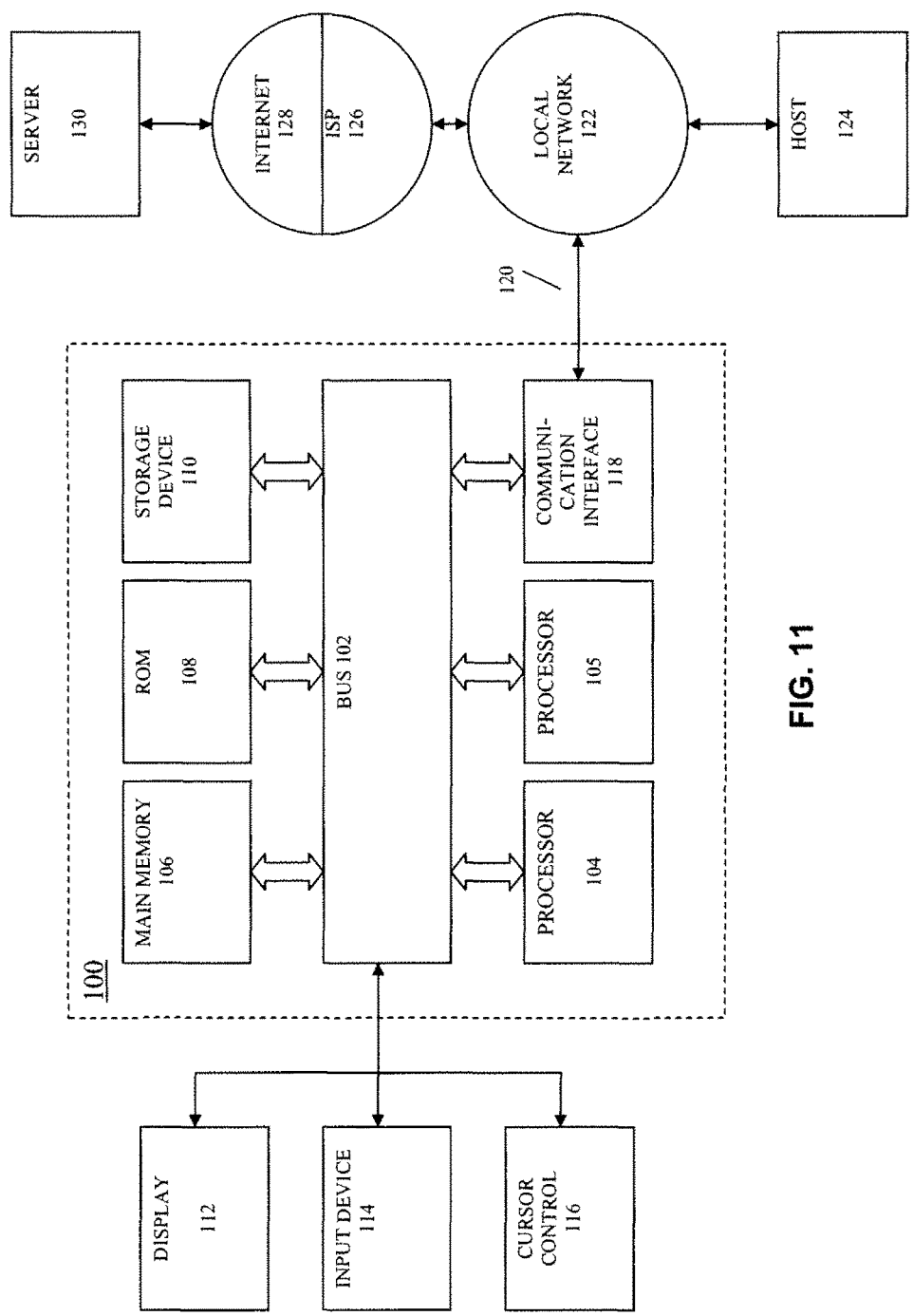
FIG. 11 is a block diagram that illustrates a computer system which can assist in the implementation of the simulation method of the present invention.

FIG. 11 is a block diagram that illustrates a computer system 100 which can assist and/or implement the model term selection methods for lithographic simulation disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hardwired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
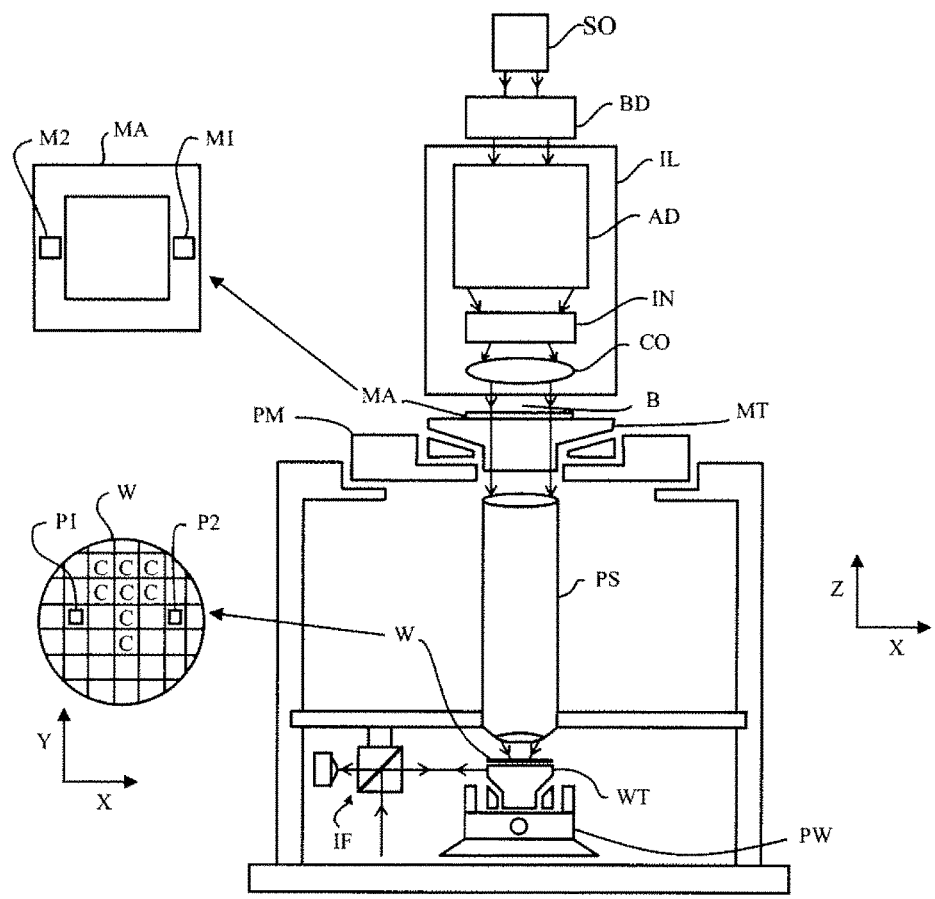
FIG. 12 schematically depicts a lithographic projection apparatus suitable for use with the method of the present invention.

FIG. 12 schematically depicts an exemplary lithographic projection apparatus for which lithographic processing can be simulated utilizing the process of present invention. The apparatus comprises:

- a radiation system Ex, IL, for supplying a projection beam PB of radiation. In this particular case, the radiation system also comprises a radiation source LA;
- a first object table (patterning device support or mask table) MT provided with a mask holder for holding a patterning device (e.g. mask) MA (e.g., a reticle), and connected to first positioner for accurately positioning the mask with respect to item PL;
- a second object table (substrate table) WT provided with a substrate holder for holding a substrate W (e.g., a resist-coated silicon wafer), and connected to second positioner for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may include an adjuster AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the patterning device (e.g. mask) MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or F2 lasing). The current invention encompasses at least both of these scenarios.

The beam PB subsequently intercepts the patterning device (e.g. mask) MA, which is held on a patterning device support (e.g. mask table) MT. After being reflected by the patterning device (e.g. mask) MA, the beam PB passes through the lens PL, which focuses the beam PB onto a target portion C of the substrate W. With the aid of the second positioner (and interferometric measuring means IF), the substrate table WT can be moved accurately, e.g. so as to position different target portions C in the path of the beam PB. Similarly, the first positioner can be used to accurately position the patterning device (e.g. mask) MA with respect to the path of the beam PB, e.g., after mechanical retrieval of the patterning device (e.g. mask) MA from a patterning device library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the patterning device support (e.g. mask table) MT may just be connected to a short stroke actuator, or may be fixed.

The depicted tool can be used in two different modes:

In step mode, the patterning device support (e.g. mask table) MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device support (e.g. mask table) MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

What is claimed is:

1. A method comprising:
   identifying a software model for simulating a lithographic manufacturing process, the software model comprising a finite number of mathematical terms added together, which when combined with a mathematical representation of a mask, generate a result that simulates performance of the lithographic manufacturing process using the mask, wherein each of at least two of the mathematical terms comprises a same or different variable;
   identifying a geometric or frequency characteristic of a desired mask layout;
   selecting, by a hardware computer, a subset of the finite number of terms of the software model based on the identified characteristic of the desired mask layout; and
   using the software model with only the selected subset of the plurality of terms to perform a computer simulation of the performance of the lithographic manufacturing process, where an output of the software model is used to design, control and/or modify an aspect of the lithographic manufacturing process and/or of a physical object or apparatus for use in the lithographic manufacturing process.

2. A method according to claim 1, wherein the selecting step includes:
   preparing a mathematical representation of the desired mask layout based on the identified characteristic;
   for each of the plurality of terms, calculating an aerial image intensity contribution of the each term in response to the mathematical representation of the desired mask layout based on the identified characteristic; and
   selecting the subset of the plurality of terms based on the respective calculated aerial intensity contributions.

3. A method according to claim 1, wherein the selecting step includes:
preparing a mathematical representation of the desired mask layout based on the identified characteristic;
forming a new set of terms corresponding to the plurality of terms, wherein the new set of terms are weighted by the mathematical representation of the desired mask layout based on the identified characteristic; and
selecting the subset of the plurality of terms based on the corresponding new terms.

4. A method according to claim 1, wherein the selecting step includes:
preparing a mathematical representation of the desired mask layout based on the identified characteristic;
for each of the plurality of terms, calculating a value using the mathematical representation of the desired mask layout based on the identified characteristic; and
ranking the plurality of terms based on the calculated value.

5. A method according to claim 1, wherein each of the plurality of terms have an associated magnitude, the method further comprising selecting a second subset of the plurality of terms based on the associated magnitudes, and using the selected second subset in addition to the selected subset to simulate the performance of the lithographic manufacturing process.

6. A method according to claim 1, wherein the plurality of terms represent a perturbation between the lithographic manufacturing process and a different lithographic manufacturing process.

7. A method according to claim 1, wherein the plurality of terms is formed according to Hopkins theory.

8. A method according to claim 1, wherein the plurality of terms comprise Transmission Cross Coefficients (TCCs).

9. A computer program product comprising a non-transitory computer-readable medium having instructions recorded therein, which when executed by a hardware computer, cause the computer to perform at least:
identification of a software model for simulating a lithographic manufacturing process, the software model comprising a finite number of mathematical terms added together, which when combined with a mathematical representation of a mask, generate a result that simulates performance of the lithographic manufacturing process using the mask, wherein each of at least two of the mathematical terms comprises a same or different variable;
identification of a geometric or frequency characteristic of a desired mask layout;
selection of a subset of the finite number terms of the software model based on the identified characteristic of the desired mask layout; and
use of the software model with only the selected subset of the plurality of terms to perform a computer simulation of the performance of the lithographic manufacturing process, where an output of the software model is used to design, control and/or modify an aspect of the lithographic manufacturing process and/or of a physical object or apparatus for use in the lithographic manufacturing process.

10. A computer program product according to claim 9, wherein the selecting step includes:
preparing a mathematical representation of the desired mask layout based on the identified characteristic;
for each of the plurality of terms, calculating an aerial image intensity contribution of the each term in response to the mathematical representation of the desired mask layout based on the identified characteristic; and
selecting the subset of the plurality of terms based on the respective calculated aerial intensity contributions.

11. A computer program product according to claim 9, wherein the selecting step includes:
preparing a mathematical representation of the desired mask layout based on the identified characteristic;
forming a new set of terms corresponding to the plurality of terms, wherein the new set of terms are weighted by the mathematical representation of the desired mask layout based on the identified characteristic; and
selecting the subset of the plurality of terms based on the corresponding new terms.

12. A computer program product according to claim 9, wherein the selecting step includes:
preparing a mathematical representation of the desired mask layout based on the identified characteristic;
for each of the plurality of terms, calculating a value using the mathematical representation of the desired mask layout based on the identified characteristic; and
ranking the plurality of terms based on the calculated value.

13. A computer program product according to claim 9, wherein each of the plurality of terms have an associated magnitude, the method further comprising selecting a second subset of the plurality of terms based on the associated magnitudes, and using the selected second subset in addition to the selected subset to simulate the performance of the lithographic manufacturing process.

14. A computer program product according to claim 9, wherein the plurality of terms represent a perturbation between two different lithographic manufacturing processes.

15. A computer program product according to claim 9, wherein the plurality of terms is formed according to Hopkins theory.

16. A computer program product according to claim 9, wherein the plurality of terms comprise Transmission Cross Coefficients (TCCs).

17. A method, comprising:
identifying a software model of a lithographic manufacturing process, the software model comprising a series of N mathematical terms, each of the terms having an associated magnitude and each of at least two of the mathematical terms comprising a same or different variable;
determining, by a hardware computer, a contribution of each of the N mathematical terms to an aerial image formed by the lithographic manufacturing process using a mask layout;
ranking the N mathematical terms, wherein the ranking comprises the determined contributions; and
selecting a subset of the N mathematical terms based on the ranking of the determined contributions, the selected subset being used to perform computer simulation of performance of the lithographic manufacturing process and where an output of the simulation is used to design, control and/or modify an aspect of the lithographic manufacturing process and/or of a physical object or apparatus for use in the lithographic manufacturing process.

18. A method according to claim 17, wherein the mathematical terms comprise Transmission Cross Coefficients (TCCs).

19. A method according to claim 17, wherein the determining comprises:

preparing a mathematical representation of the desired mask layout; and for each of the plurality of terms, calculating an aerial image intensity contribution of each term in response to the mathematical representation of the mask layout.

20. A method according to claim 17, wherein each of the plurality of terms have an associated magnitude, the method further comprising selecting a second subset of the plurality of terms based on the associated magnitudes, and using the selected second subset in addition to the selected subset to simulate the performance of the lithographic manufacturing process.

21. A method according to claim 17, wherein the plurality of terms represent a perturbation between the lithographic manufacturing process and a different lithographic manufacturing process.

22. A method according to claim 17, wherein the plurality of terms is formed according to Hopkins theory.

23. A computer program product comprising a non-transitory computer-readable medium having instructions recorded therein, which when executed by a hardware computer, cause the computer to perform at least:

identification of a software model of a lithographic manufacturing process, the software model comprising a series of N mathematical terms, each of the terms having an associated magnitude and each of at least two of the mathematical terms comprising a same or different variable;

identification of a mask layout;

determination of a contribution of each of the N mathematical terms to an aerial image formed by the lithographic manufacturing process using the identified mask layout;

ranking of the N mathematical terms, wherein the ranking comprises the determined contributions; and selection of a subset of the N mathematical terms based on the ranking of the determined contributions, the selected subset being used to perform computer simulation of performance of the lithographic manufacturing process and where an output of the computer simulation is used to design, control and/or modify an aspect of the lithographic manufacturing process and/or of a physical object or apparatus for use in the lithographic manufacturing process.

* * * * *